United States Patent
Kim et al.

(10) Patent No.: US 12,490,574 B2
(45) Date of Patent: Dec. 2, 2025

(54) SKIN-CONFORMABLE BIOSIGNAL MONITORING SENSOR BY APPLYING ORGANIC-INORGANIC HYBRID PHOTO TRANSISTOR AND MANUFACTURING METHOD THEREOF

(71) Applicant: UIF (University Industry Foundation), Yonsei University, Seoul (KR)

(72) Inventors: Hyun Jae Kim, Seoul (KR); Byung Ha Kang, Seoul (KR); Jin Hyeok Lee, Seoul (KR); Kyung Ho Park, Seoul (KR); Hyung Tae Kim, Seoul (KR)

(73) Assignee: UIF (University Industry Foundation), Yonsei University, Seoul (KR)

(*) Notice: Subject to any disclaimer, the term of this patent is extended or adjusted under 35 U.S.C. 154(b) by 700 days.

(21) Appl. No.: 17/709,244

(22) Filed: Mar. 30, 2022

(65) Prior Publication Data
US 2022/0255028 A1 Aug. 11, 2022

Related U.S. Application Data

(63) Continuation-in-part of application No. PCT/KR2021/010961, filed on Aug. 18, 2021.

(30) Foreign Application Priority Data

Feb. 8, 2021 (KR) .................. 10-2021-0017663

(51) Int. Cl.
*H01L 21/56* (2006.01)
*C08L 65/00* (2006.01)
(Continued)

(52) U.S. Cl.
CPC .............. *H10K 30/87* (2023.02); *C08L 65/00* (2013.01); *H10K 71/12* (2023.02); *H10K 85/111* (2023.02); *C08L 2203/20* (2013.01)

(58) Field of Classification Search
CPC ...... H10K 30/87; H10K 71/12; H10K 85/111; H10K 10/466; H10K 10/488; H10K 19/10; C08L 65/00; C08L 2203/20; C08G 2261/12; C08G 2261/124; C08G 2261/1412; C08G 2261/3223; C08G 2261/334; C08G 2261/344;
(Continued)

(56) References Cited

U.S. PATENT DOCUMENTS

2006/0054987 A1* 3/2006 Nii .................. H10F 39/18
257/435
2007/0116895 A1* 5/2007 Shukla ............ B82Y 10/00
428/473.5
(Continued)

FOREIGN PATENT DOCUMENTS

| JP | 2008-226959 A | 9/2008 |
|---|---|---|
| KR | 10-1560282 B1 | 10/2015 |
| KR | 10-2019-0036446 A | 4/2019 |

*Primary Examiner* — Sheikh Maruf

(57) ABSTRACT

The present exemplary embodiments provide a sensor of monitoring a biosignal in a low power mode or a high precision mode by interacting a plurality of photo transistors implemented by light absorption layers having different organic orientations by a solution process and a manufacturing method thereof.

4 Claims, 21 Drawing Sheets

(51) Int. Cl.
*H10K 30/87* (2023.01)
*H10K 71/12* (2023.01)
*H10K 85/10* (2023.01)

(58) Field of Classification Search
CPC ............ C08G 2261/92; C08G 2261/94; C08G 61/126; C09D 165/00
USPC .......................................................... 257/40
See application file for complete search history.

(56) References Cited

U.S. PATENT DOCUMENTS

| | | | | |
|---|---|---|---|---|
| 2008/0207917 A1* | 8/2008 | Li | ........................ | C08G 61/124 548/418 |
| 2008/0214839 A1* | 9/2008 | Jung | ...................... | H10K 30/50 549/50 |
| 2009/0046185 A1* | 2/2009 | Ota | ........................ | H04N 23/70 348/294 |
| 2009/0189150 A1* | 7/2009 | Lee | ........................ | C08G 61/123 526/240 |
| 2009/0283723 A1* | 11/2009 | Meyer-Friedrichsen | .................... | H10K 85/40 252/500 |
| 2010/0319778 A1* | 12/2010 | Kastler | ................ | H10K 85/621 546/37 |
| 2011/0109776 A1* | 5/2011 | Kawai | .................. | H10F 39/806 348/294 |
| 2011/0155247 A1* | 6/2011 | Quinn | .................. | C07D 471/06 546/37 |
| 2012/0161117 A1* | 6/2012 | Chen | .................... | H10K 85/113 257/E51.026 |
| 2013/0032694 A1* | 2/2013 | Nakata | .................. | H04N 25/62 250/208.1 |
| 2014/0263945 A1* | 9/2014 | Huang | .................. | H10K 30/65 257/40 |
| 2015/0372241 A1* | 12/2015 | Park | ...................... | C07D 495/14 257/40 |
| 2016/0017077 A1* | 1/2016 | Lee | ...................... | C08G 61/124 526/256 |
| 2016/0043329 A1* | 2/2016 | Lee | .................... | H10K 85/6576 257/40 |
| 2016/0276413 A1* | 9/2016 | Iida | ........................ | H10F 19/33 |
| 2016/0320494 A1* | 11/2016 | Hartmann | ................ | G01T 1/16 |
| 2017/0179463 A1* | 6/2017 | Moriwaki | ............... | H01M 4/02 |
| 2017/0338431 A1* | 11/2017 | Ro | ...................... | H10K 85/6572 |
| 2018/0204882 A1* | 7/2018 | Segawa | .................. | H04N 25/76 |
| 2019/0013489 A1* | 1/2019 | Yamaguchi | ............ | H04N 25/76 |
| 2019/0157594 A1* | 5/2019 | Ro | ........................ | H10K 85/636 |
| 2019/0280141 A1* | 9/2019 | Takeuchi | ............... | H10F 77/147 |
| 2020/0075865 A1* | 3/2020 | He | ........................ | H10K 85/151 |
| 2020/0205680 A1 | 7/2020 | Boukhayma | | |
| 2020/0235168 A1* | 7/2020 | Lee | ........................ | H10K 39/32 |
| 2021/0036061 A1* | 2/2021 | Leem | .................... | H10F 39/193 |
| 2021/0288113 A1* | 9/2021 | Kawaguchi | ......... | H10F 39/8037 |
| 2021/0367153 A1* | 11/2021 | He | ........................ | H10K 85/151 |
| 2022/0131098 A1* | 4/2022 | Leem | .................... | H10K 39/32 |

* cited by examiner

DPP2ODT2 T/IGZO
PHOTO TRANSISTOR

SKIN-CONFORMABLE BIOSIGNAL MONITORING SENSOR BY APPLYING ORGANIC-INORGANIC HYBRID PHOTO TRANSISTOR AND MANUFACTURING METHOD THEREOF

CROSS-REFERENCE TO RELATED APPLICATIONS

This application is a by-pass continuation-in-part application of International Patent Application No. PCT/KR2021/010961 filed on Aug. 18, 2021, which claims the benefit of Korean Patent Application No. KR 10-2021-0017663, filed on Feb. 8, 2021, is incorporated by reference herein in its entirety.

TECHNICAL FIELD

The technical field of the present disclosure relates to an organic-inorganic hybrid photo transistor and a biosignal monitoring sensor. This study relates to a nano and material technology development project (No. 2018M3A7B4071521).

BACKGROUND ART

The contents described in this section merely provide background information on the present exemplary embodiment but do not constitute the related art.

A healthcare monitoring device monitors biometric information of a user in real time. The user measures biometric information of the user using a mobile device such as a smart phone or a wearable device which is worn on a body.

For example, a photoplethysmography (PPG) sensor measures a PPG signal from the user. An electronic device including the PPG sensor analyzes the PPG signal to acquire biometric information including a heart rate, an oxygen saturation (SpO2), stress, arrhythmia, and a blood pressure.

RELATED ART DOCUMENT

Patent Document (Patent Document 1) Korean Unexamined Patent Application Publication No. 10-2019-0036446 (published on Apr. 4, 2019)

SUMMARY OF THE INVENTION

A major object of exemplary embodiments of the present disclosure is to monitor a biosignal in a low power mode or a high precision mode by interacting a plurality of photo transistors implemented by light absorption layers having different organic orientations by a solution process.

Other and further objects of the present invention which are not specifically described can be further considered within the scope easily deduced from the following detailed description and the effect.

According to an aspect of the present embodiment, a manufacturing method of a biosignal monitoring sensor includes forming a light sensor on a substrate; forming a first photo transistor having a first light absorption layer on the substrate using a first organic solution; and forming a second photo transistor having a second light absorption layer on the substrate using a second organic solution.

In the forming of a first photo transistor, a solution process is performed based on the first organic solution including a first diketopyrrolopyrrole (DPP) polymer and In the forming of a second photo transistor, a solution process is performed based on the second organic solution including a second DPP polymer.

The first organic solution and the second organic solution are set to have different organic orientation ratios with respect to the first light absorption layer and the second light absorption layer by adjusting a solvent or adjusting a solution process condition.

According to another aspect of the present embodiment, a manufacturing method of a photo transistor includes forming a gate insulator on a gate electrode; forming an active layer on the gate insulator based on oxide; depositing a source electrode and a drain electrode on the active layer; and forming a light absorption layer on the active layer using an organic solution.

In the forming of a light absorption layer, a solution process is performed based on an organic solution including a diketopyrrolopyrrole (DPP) polymer.

In the forming of a light absorption layer, an organic material orientation ratio is set within a predetermined range by adjusting a solvent of the organic solution or a solution process condition.

When the solvent is adjusted, a type or a ratio of the solvent or a combination thereof is differently set and when the solution process condition is adjusted, a coating speed, a temperature, a time, or a combination thereof is differently set.

According to another aspect of the present embodiment, a photo transistor includes a gate electrode which controls a state of the photo transistor; a gate insulator connected to the gate electrode; an active layer which is connected to the gate insulator and is formed based on an oxide to transmit a carrier; a source electrode and a drain electrode deposited on the active layer; and a light absorption layer which is connected to the active layer and is formed based on polymer.

The polymer of the light absorption layer includes a diketopyrrolopyrrole (DPP) polymer.

An organic material orientation ratio of the polymer of the light absorption layer is set in a predetermined range.

A potential barrier of an interface of the light absorption layer and the active layer is controlled by adjusting an organic material orientation ratio of the polymer of the light absorption layer.

When a face-on orientation ratio of the organic material orientation ratio is reduced, a surface potential is increased, a potential barrier at the interface is increased, hole accumulation at the interface is increased, and re-combination of electrons and holes is increased to reduce neuroplasticity or persistent photoconductance.

When a face-on orientation ratio of the organic material orientation ratio is increased, a surface potential is reduced, a potential barrier at the interface is reduced, and a transport efficiency of the electron is increased to increase the photo sensitivity.

According to another aspect of the present embodiment, a biosignal monitoring sensor includes a substrate, a light source which is connected to the substrate; a first photo transistor which is connected to the substrate and has a first light absorption layer; and a second photo transistor which is connected to the substrate and has a second light absorption layer, the first photo transistor operates in a first sensing mode and the second photo transistor operates in a second sensing mode.

The first photo transistor and the second photo transistor transmits feedback to each other to be controlled to be on/off.

The first photo transistor may transmit a feedback to the second photo transistor based on a magnitude of the biosignal.

The second photo transistor may transmit a feedback to the first photo transistor based on a frequency of the biosignal.

The first light absorption layer has a first face-on orientation ratio, the second light absorption layer has a second face-on orientation ratio, and the first face-on orientation ratio is set to be higher than the second face-on orientation ratio.

In the first sensing mode, the first photo transistor operates as a low power sensor according to the first face-on orientation ratio.

In the second sensing mode, the second photo transistor operates as a high precision sensor according to the second face-on orientation ratio.

As described above, according to the exemplary embodiments of the present disclosure, a biosignal can be monitored in a low power mode or a high precision mode by interacting a plurality of photo transistors implemented by light absorption layers having different organic orientations by a solution process.

Even if the effects are not explicitly mentioned here, the effects described in the following specification which are expected by the technical features of the present disclosure and their potential effects are handled as described in the specification of the present disclosure.

DETAILED DESCRIPTION OF THE EMBODIMENT

Hereinafter, in the description of the present disclosure, a detailed description of the related known functions will be omitted if it is determined that the gist of the present disclosure may be unnecessarily blurred as it is obvious to those skilled in the art and some exemplary embodiments of the present disclosure will be described in detail with reference to exemplary drawings.

A photo transistor and a biosignal monitoring sensor according to the exemplary embodiment have an organic-inorganic hybrid structure including an oxide based active layer and a polymer based light absorption layer.

The photo transistor and the biosignal monitoring sensor according to the exemplary embodiment apply a diketopyrrolopyrrole (DPP) polymer to the light absorption layer to improve near-infrared ray detecting performance, a flexibility, and a stability against sweat/moisture.

The photo transistor and the biosignal monitoring sensor utilize a neuroplasticity characteristic or persistent photoconductance phenomenon to perform feedback, operation, always-on monitoring in a low power sensing mode or a high precision sensing mode.

Figure 1:
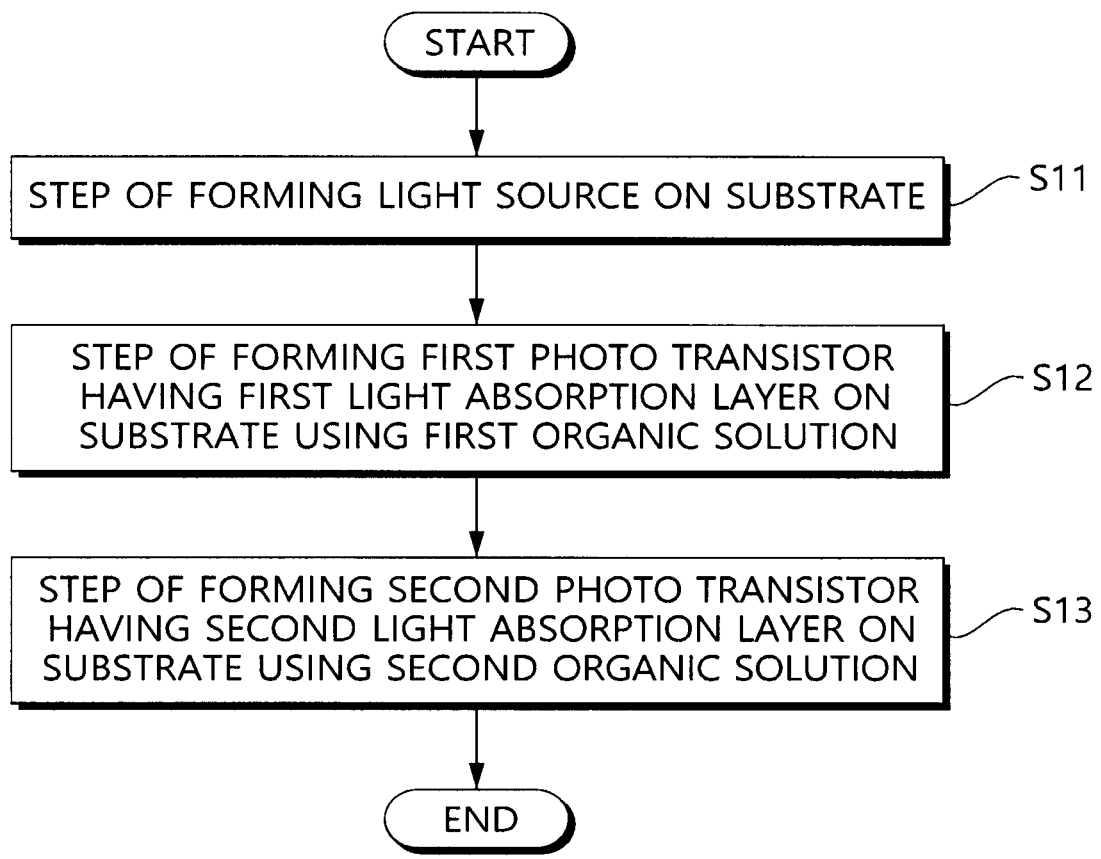
FIG. 1 is a view illustrating a manufacturing method of a biosignal monitoring sensor according to an exemplary embodiment of the present disclosure.

FIG. 1 is a view illustrating a manufacturing method of a biosignal monitoring sensor according to an exemplary embodiment of the present disclosure.

The manufacturing method of a biosignal monitoring sensor includes a step S11 of forming a light source on a substrate, a step S12 of forming a first photo transistor having a first light absorption layer on the substrate using a first organic solution, and a step S13 of forming a second photo transistor having a second light absorption layer on the substrate using a second organic solution.

In the step S12 of forming a first photo transistor, a solution process is performed based on the first organic solution including a first diketopyrrolopyrrole (DPP) polymer.

In the step S13 of forming a second photo transistor, a solution process is performed based on the second organic solution including a second DPP polymer.

The first organic solution and the second organic solution may be set to have different organic material orientation ratios with respect to the first light absorption layer and the second light absorption layer by adjusting a solvent or adjusting a solution process condition.

Figure 2:
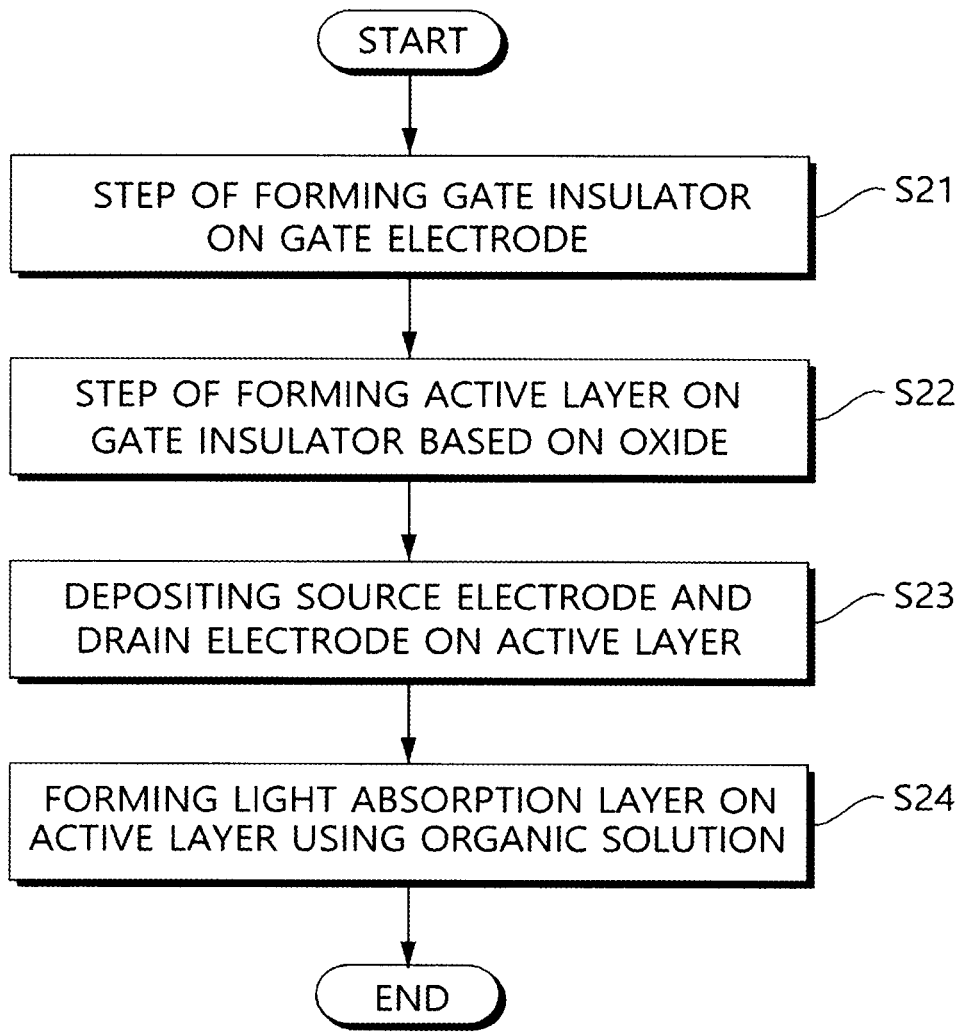
FIGS. 2 and 3 are views illustrating a manufacturing method of a photo transistor according to another exemplary embodiment of the present disclosure.
Figure 3:
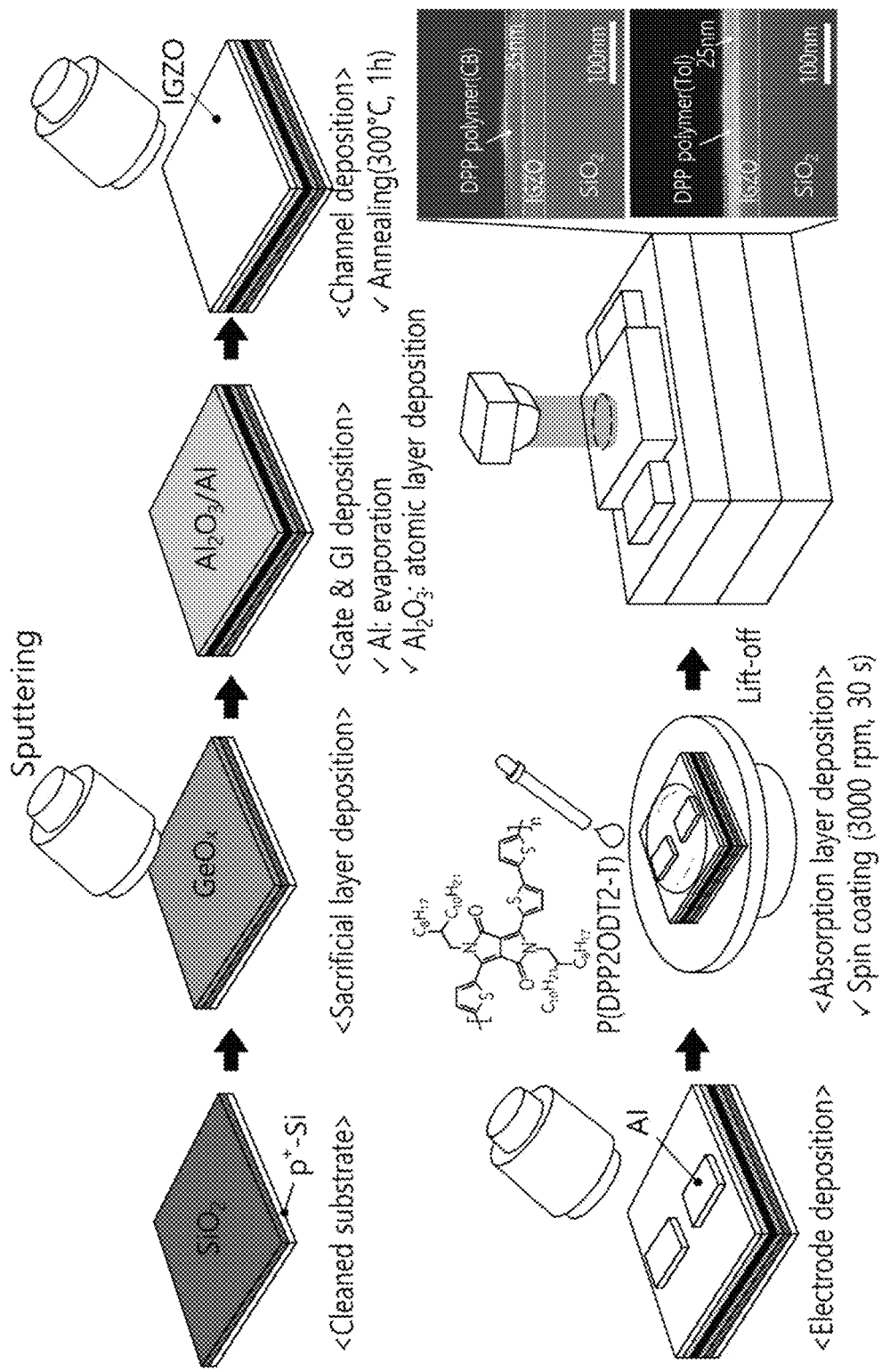

FIGS. 2 and 3 are views illustrating a manufacturing method of a photo transistor according to another exemplary embodiment of the present disclosure.

The manufacturing method of a photo transistor incudes a step S21 of forming a gate insulator in a gate electrode, a step S22 of forming an active layer on the gate insulator based on an oxide, a step S23 of depositing a source electrode and a drain electrode on the active layer, and a step S24 of forming a light absorption layer on the active layer using an organic solution.

In the step S24 of forming a light absorption layer, the solution process may be performed based on an organic solution including a diketopyrrolopyrrole polymer.

In the step S324 of forming a light absorption layer, an organic material orientation ratio may be set within a predetermined range by adjusting a solvent of the organic solution or a solution process condition. The solvent may be adjusted by differently setting a type and a ratio of solvent or a combination thereof and the solution process condition may be adjusted by differently setting a coating speed, a temperature, a time, or a combination thereof.

For example, P(DPP20DT2-T) may be applied as the DPP polymer. P(DPP20DT2-T) is an example of the DPP polymer so that another polymer including DPP may also be applied. 20D refers to 2-octyldodecyl and T refers to thiophene.

When chlorobenzene (CB) is used as a solvent, the DPP polymer is represented by DPP20DT2-T(CB) and toluene (Tol) is used as a solvent, the DPP polymer is represented by DPP20DT2-T(Tol).

A sacrificial layer is deposited on a cleansed substrate and a gate and a gate insulator are deposited. The active layer is deposited. As the oxide based active layer, indium gallium zinc oxide (IGZO) is applied and an annealing process is performed. After depositing the electrode, a DPP polymer based light absorption layer is deposited.

Figure 4:
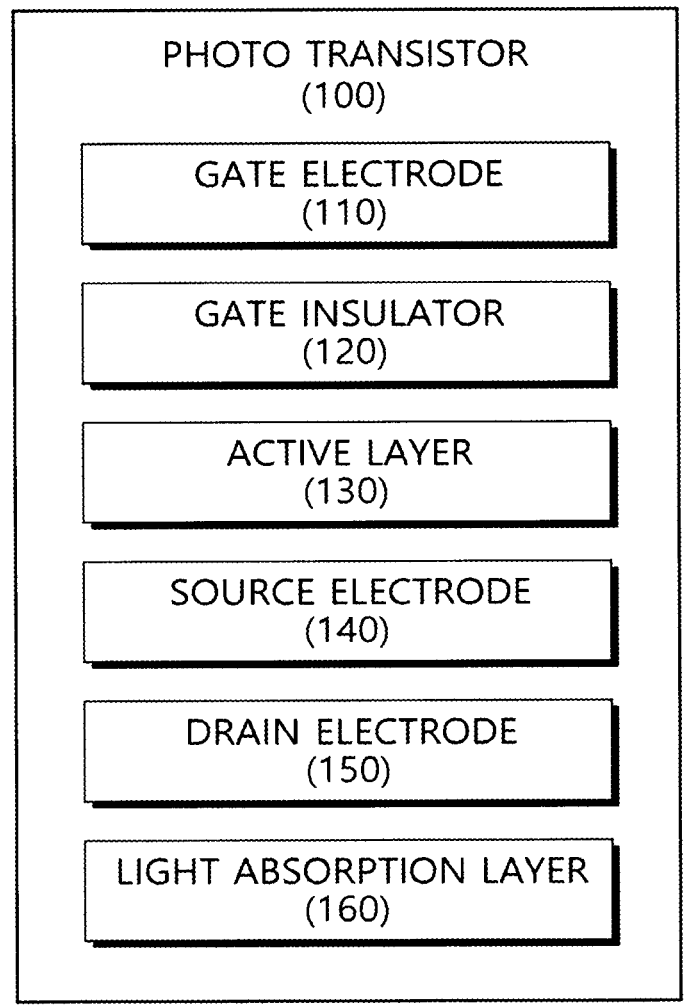
FIG. 4 is a view illustrating a photo transistor according to another exemplary embodiment of the present disclosure.
Figure 5:
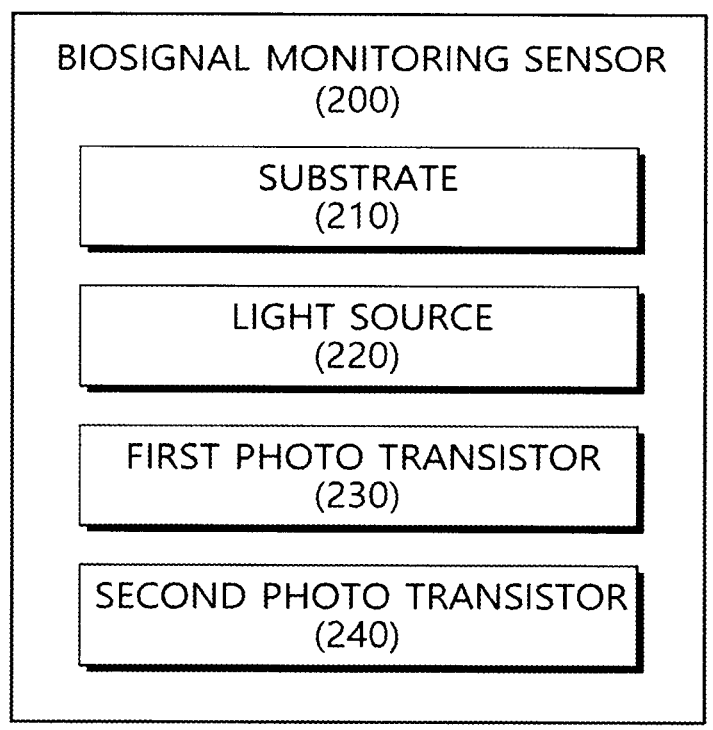
FIGS. 5 to 8 are views illustrating a biosignal monitoring sensor according to another exemplary embodiment of the present disclosure.

FIG. 4 is a view illustrating a photo transistor according to another exemplary embodiment of the present disclosure.

The photo transistor 100 includes a gate electrode 110 which controls a state of the photo transistor, a gate insulator 120 connected to the gate electrode 110, an active layer 130 which is connected to the gate insulator 120 and is formed based on oxide to transmit a carrier, a source electrode 140 and a drain electrode 150 deposited on the active layer 130, and a light absorption layer 160 which is connected to the active layer 130 and is formed based on polymer. The active layer 130 serves as a channel.

The photo transistor 100 may be implemented with a polymer/oxide hybrid structure in which P(DPP20DT2-T) is applied as the light absorption layer and the active layer 130 is configured by IGZO. Polymer corresponds to a semiconductor material which absorbs a wavelength in a near infrared ray (850 to 950 nm) band, has the hydrophobicity, and has a high flexibility. The oxide corresponds to a semiconductor material having a very low leakage current.

The polymer of the light absorption layer 160 may include diketopyrrolopyrrole (DPP) polymer. An organic material orientation ratio of the polymer of the light absorption layer 160 may be set in a predetermined range. A potential barrier of an interface between the light absorption layer 160 and the active layer 130 may be controlled by adjusting the organic material orientation ratio of the polymer of the light absorption layer 160.

FIGS. 5 to 8 are views illustrating a biosignal monitoring sensor according to another exemplary embodiment of the present disclosure.

A biosignal monitoring sensor 200 includes a substrate 210, a light source 220 connected to the substrate 210, a first photo transistor 230 which is connected to the substrate 210 and has a first light absorption layer, and a second photo transistor 240 which is connected to the substrate 210 and has a second light absorption layer.

A plurality of light sources 220 may be implemented and an infrared ray and red light may be used.

In a first sensing mode, the first photo transistor 230 operates and in a second sensing mode, the second photo transistor 240 operates.

Figure 7:
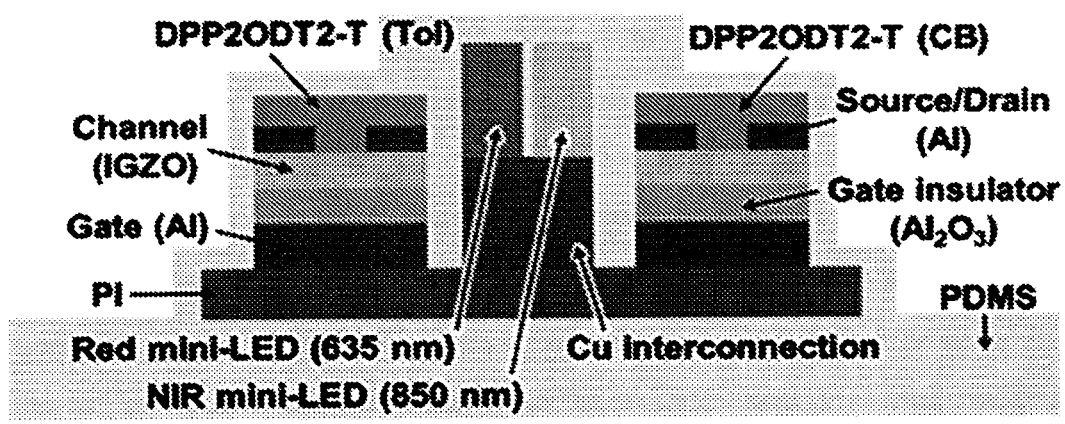
Figure 8:
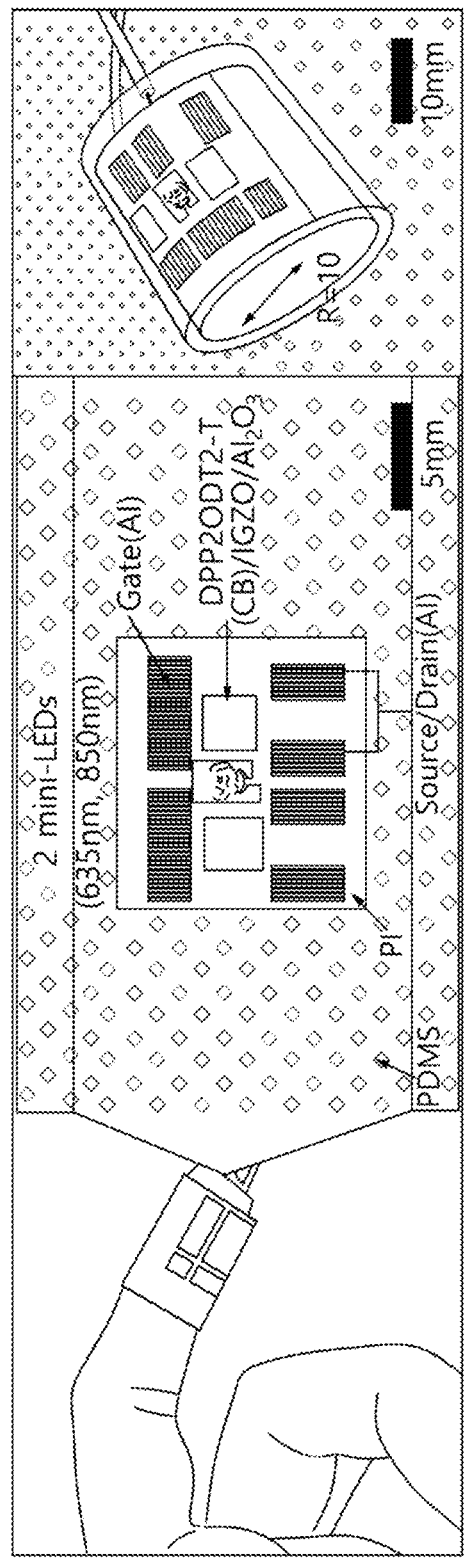

FIGS. 7 and 8 illustrate an exemplary biosignal monitoring sensor in which the light absorption layers are implemented by DPP20DT2-T(CB) and DPP20DT2-T(Tol). As the light source, near-infrared ray may be applied.

Figure 6:
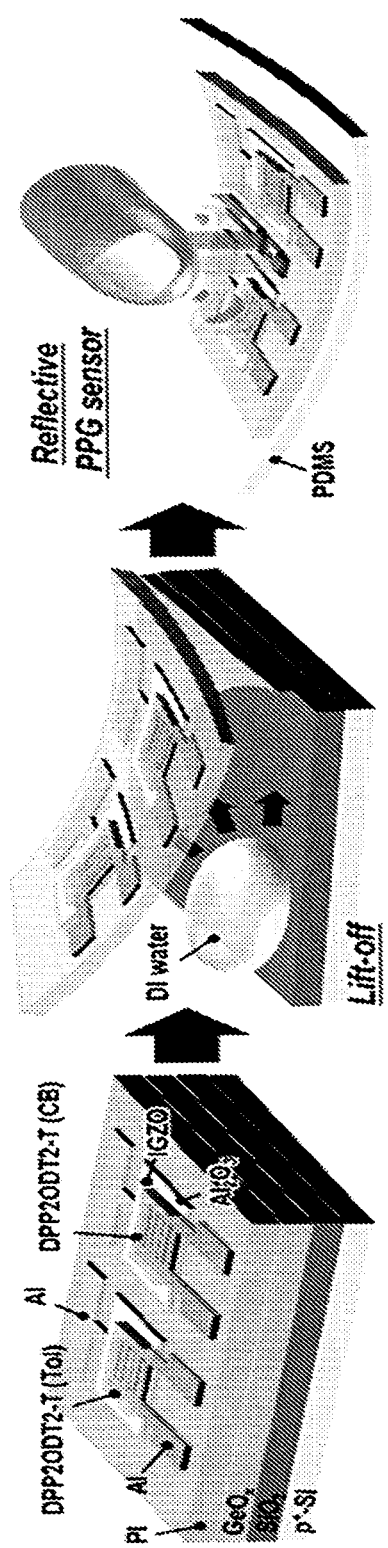

The biosignal monitoring sensor may be implemented by a reflective type or a transmissive type depending on the placement of the light source and the photo transistor. FIG. 6 illustrates a reflective type and the light source is disposed between the plurality of photo transistors.

Figure 9:
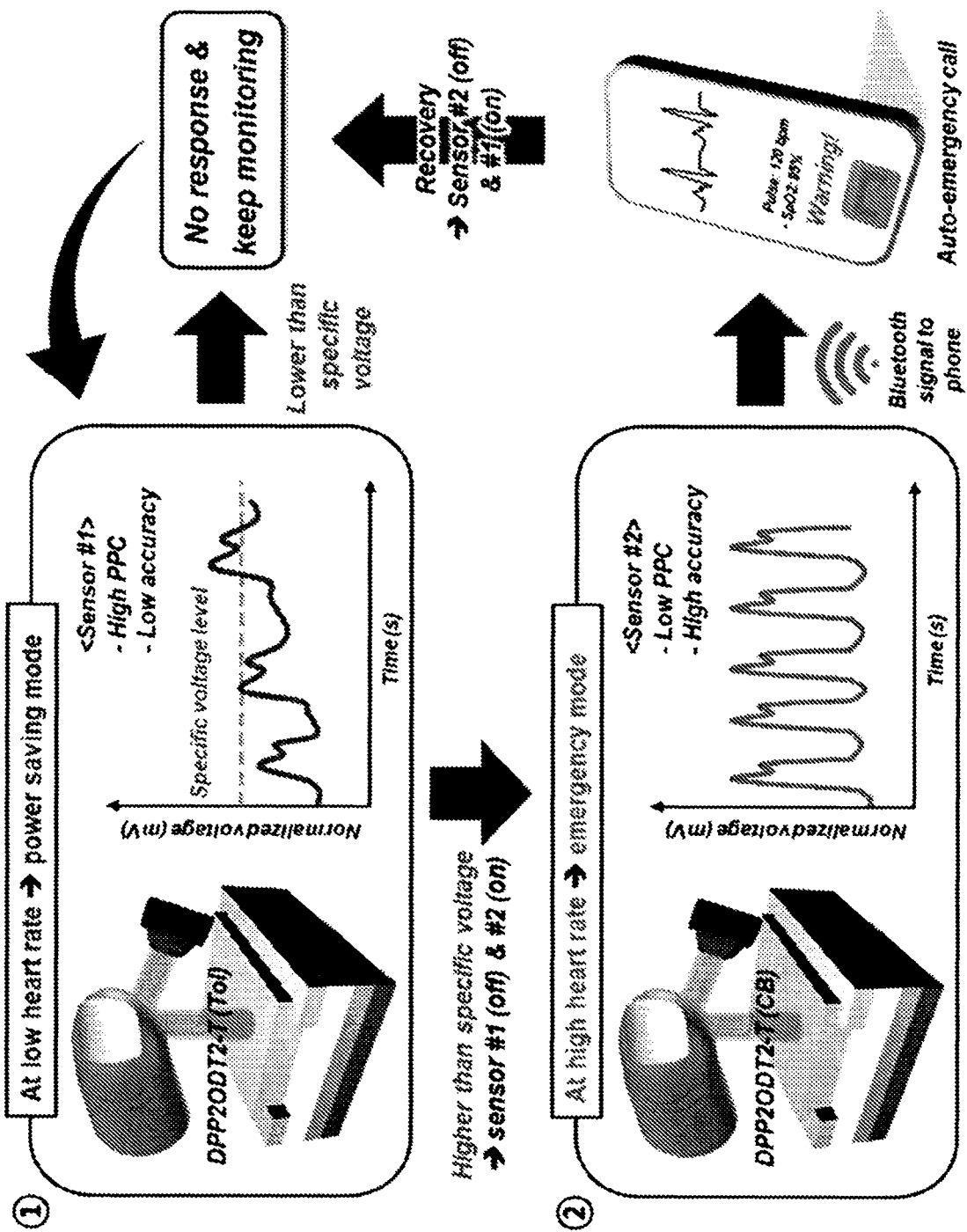
FIGS. 9 and 10 are views illustrating an operation of a biosignal monitoring sensor according to another exemplary embodiment of the present disclosure.
Figure 10:
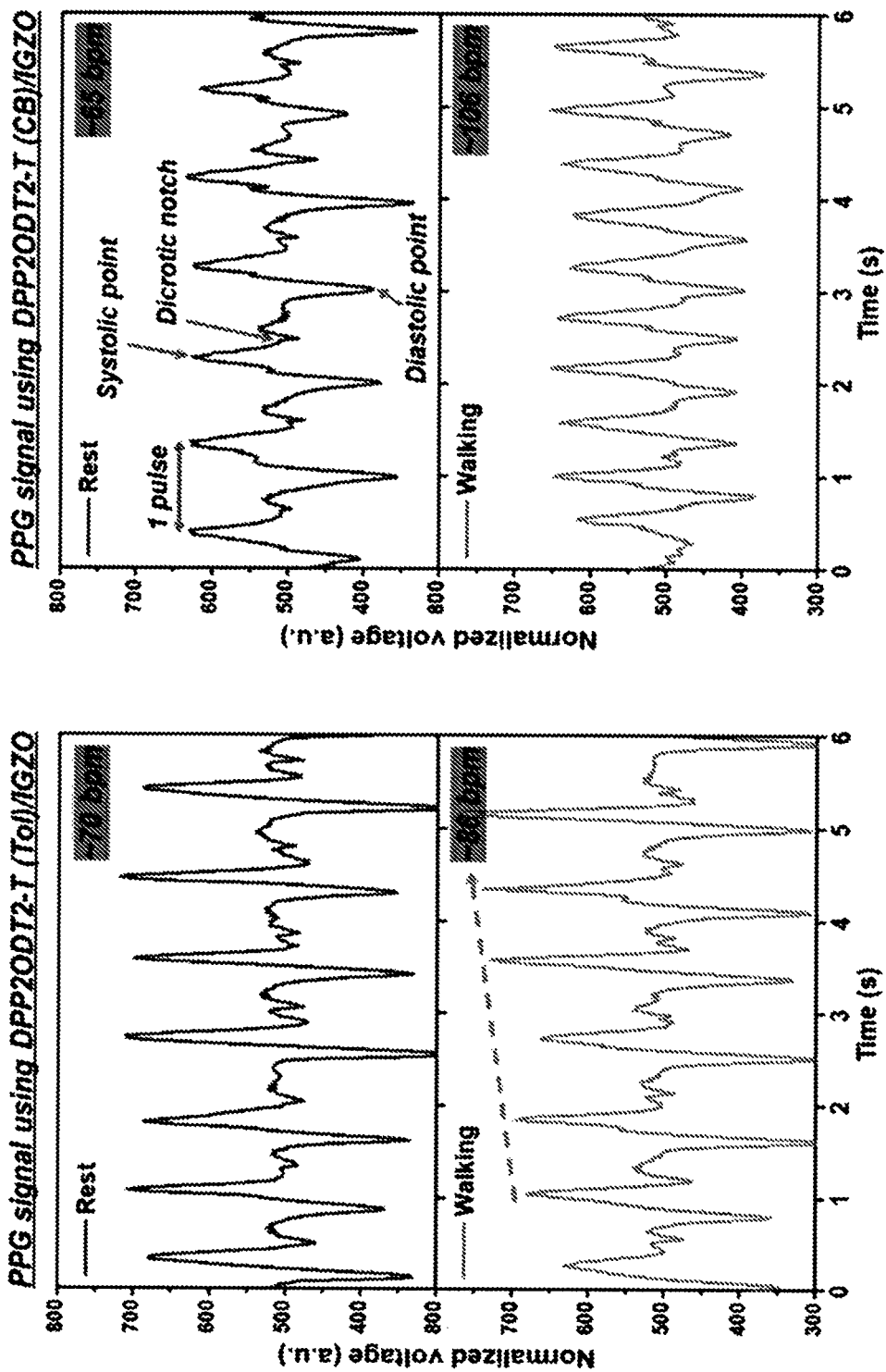

FIGS. 9 and 10 are views illustrating an operation of a biosignal monitoring sensor according to another exemplary embodiment of the present disclosure.

At a low heart rate, it is a stable state so that an accurate measurement is not necessary but at a high heart rate, a signal level (for example, a voltage level) exceeds a predetermined level so that only whether to exceed can be measured.

At the high heart rate, it is an emergency state so that it is necessary to measure both the heart rate and the oxygen saturation using a sensor which precisely measures.

A photo-sensitive characteristic of the photo transistor varies due to the organic material orientation of the light absorption layer which varies depending on the solvent. In the photo transistor, a persistent photoconductance phenomenon which varies depending on a heart rate cycle may be generated by the organic material orientation. A low heart rate state and a high heart rate state are distinguished by the organic material orientation to operate an appropriate sensor. An always-on monitoring system can be implemented with an efficient power.

Referring to FIG. 10, the first photo transistor outputs a constant signal level at a relatively low heart rate and the signal level is increased at a relatively high heart rate. The first photo transistor which shows the above-descried phenomenon may be used in a low heart rate measurement mode. In a relationship with other photo transistor, the rising of the signal level may be used as a trigger signal.

The second photo transistor outputs a constant signal level at a relatively low or high heart rate and accurately measures the motion. The second photo transistor which shows the above-descried phenomenon may be used in a high heart rate measurement mode. When it is determined as a stable state according to the change of the heart rate, it may be used as a trigger signal in a relationship with other photo transistor.

The first photo transistor and the second photo transistor transmit feedback to each other to be controlled to be on/off. The first photo transistor is turned on and the second photo transistor is turned off or the second photo transistor is turned on and the first photo transistor is turned off.

The first photo transistor may transmit a feedback to the second photo transistor based on a magnitude of the biosignal. The second photo transistor may transmit a feedback to the first photo transistor based on a frequency of the biosignal. The photo transistor at a reception side may be controlled to be turned on/off by the feedback signal.

The first photo transistor and the second photo transistor may be directly connected or connected with a controller therebetween. The first photo transistor transmits a signal to the second photo transistor. The second photo transistor transmits a signal to the first photo transistor. The controller receives a signal from the first photo transistor and transmits a signal to the second photo transistor. The controller receives a signal from the second photo transistor and transmits a signal to the first photo transistor.

Figure 11A:
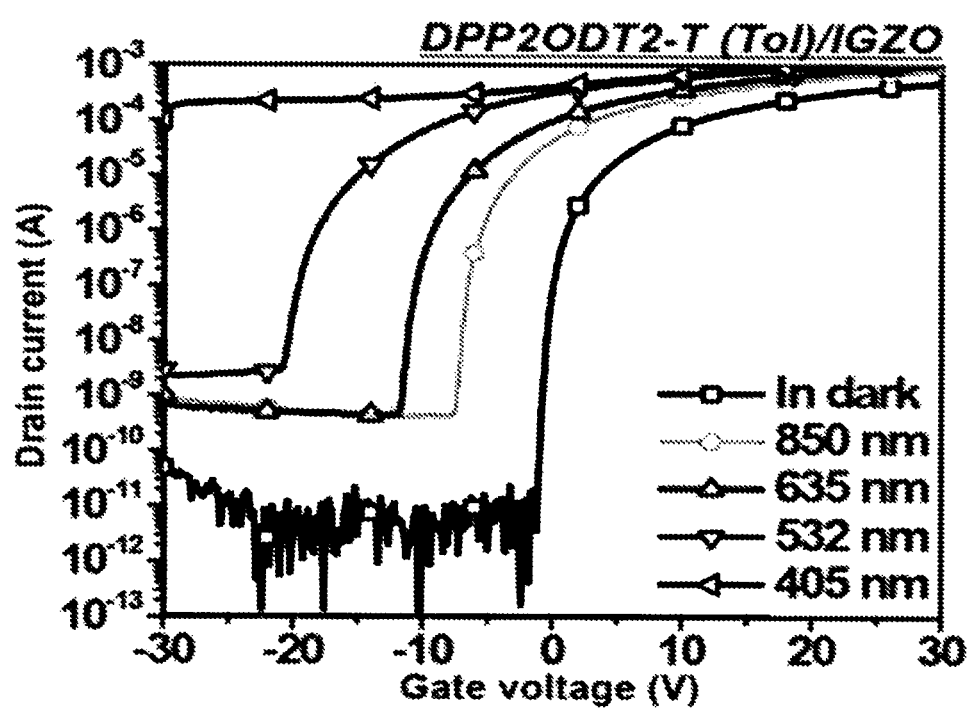
FIGS. 11A, 11B, and 12 are views illustrating a photoelectrical characteristic of a biosignal monitoring sensor according to another exemplary embodiment of the present disclosure.
Figure 11B:
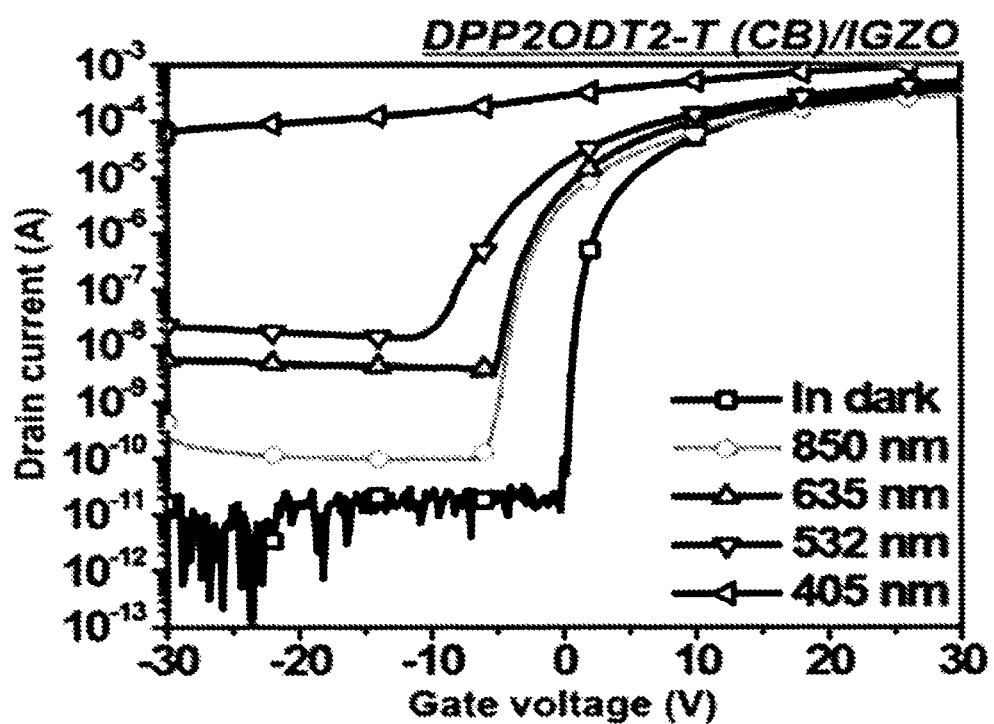
Figure 12:
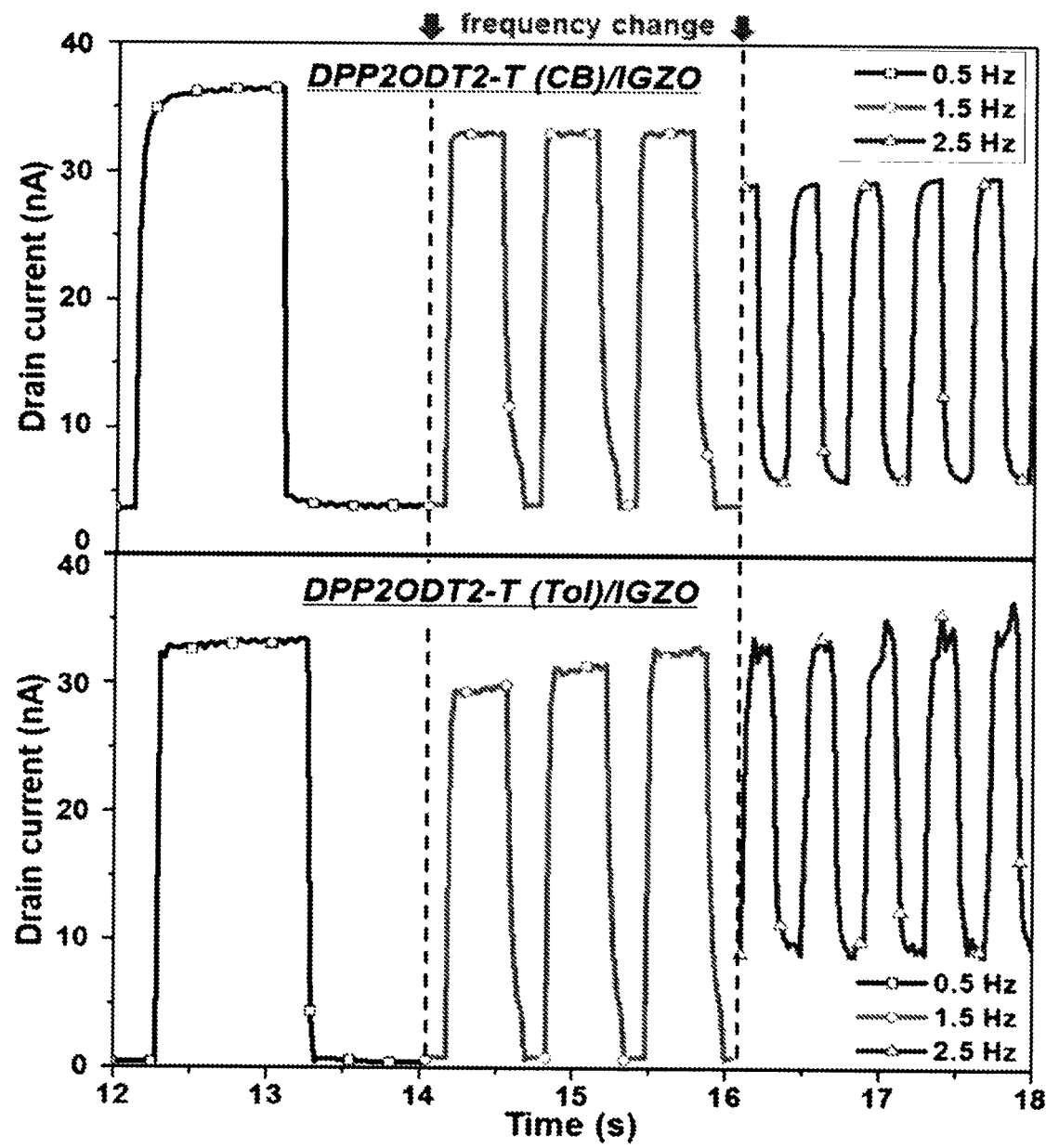

FIGS. 11 and 12 are views illustrating a photoelectrical characteristic of a biosignal monitoring sensor according to another exemplary embodiment of the present disclosure.

From the result obtained by measuring a transient photo response, it is confirmed that the photo sensing ability is excellent in the visible ray and the near-infrared region so that red, green, and near-infrared light sources can be used. The light sensing ability is excellent in a DPP20DP2-T(Tol)

light absorption layer applied element more than in a DPP20DP2-T(CB) light absorption layer applied element.

Instant current change according to on/off of light can be confirmed in both elements and excellent light response in a general human heart rate range (30 bpm to 150 bpm) can be confirmed.

When the DPP20DT2-T(CB) light absorption layer is applied, a stable current value is confirmed and it is confirmed that there is almost no PPC phenomenon.

When the DPP20DT2-T(Tol) light absorption layer is applied, an unstable current value at a high frequency is confirmed and it is confirmed that there is a persistent photoconductance (PPC) phenomenon in which the current rises as the photo reaction persists.

Figure 13:
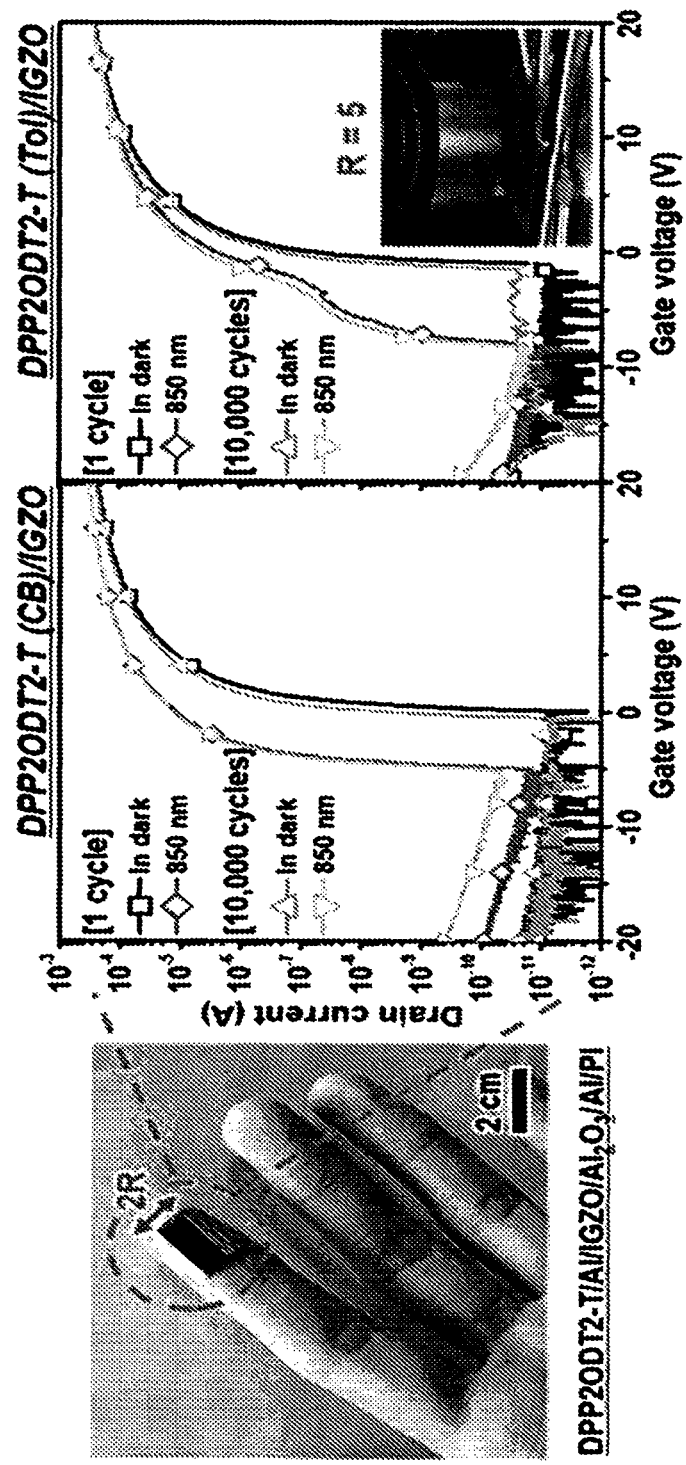
FIG. 13 is a view illustrating a flexibility of a biosignal monitoring sensor according to another exemplary embodiment of the present disclosure.

FIG. 13 is a view illustrating a flexibility of a biosignal monitoring sensor according to another exemplary embodiment of the present disclosure.

As a result of evaluating a flexibility under a condition of 5 mm which is smaller than a radius of curvature of approximately 10 mm suitable for a size of an index finger, it is confirmed that the flexibility of the biosignal monitoring sensor is improved by the flexibility of the room temperature deposition of the DPP20DT2-T material.

Figure 14A:
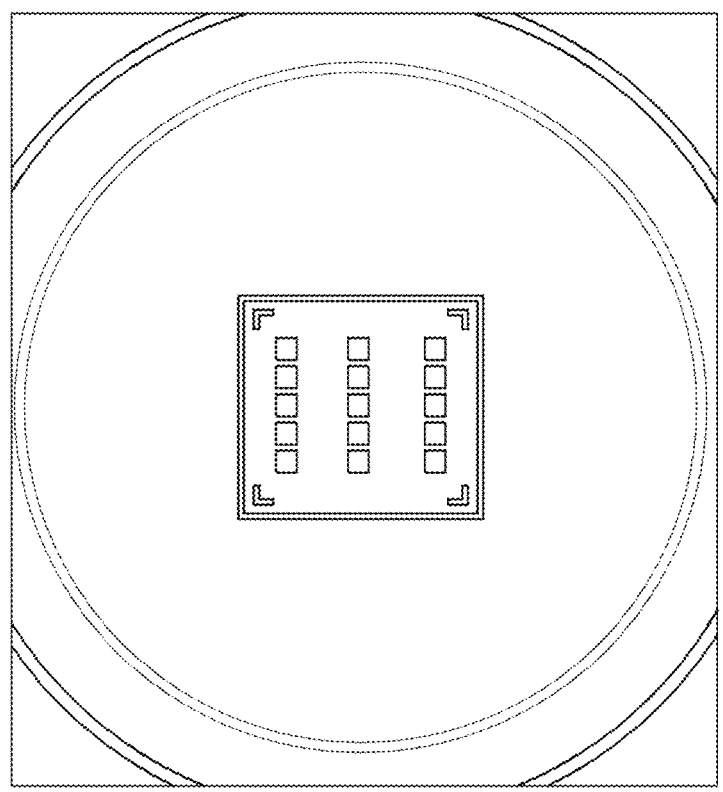
FIGS. 14A, 14B, and 15 are views illustrating a stability of a biosignal monitoring sensor according to another exemplary embodiment of the present disclosure.
Figure 14B:
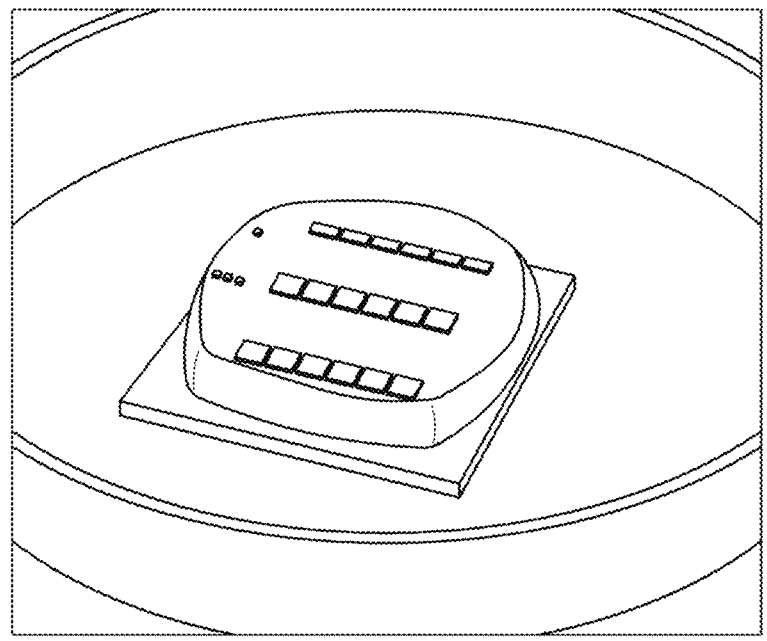
Figure 15:
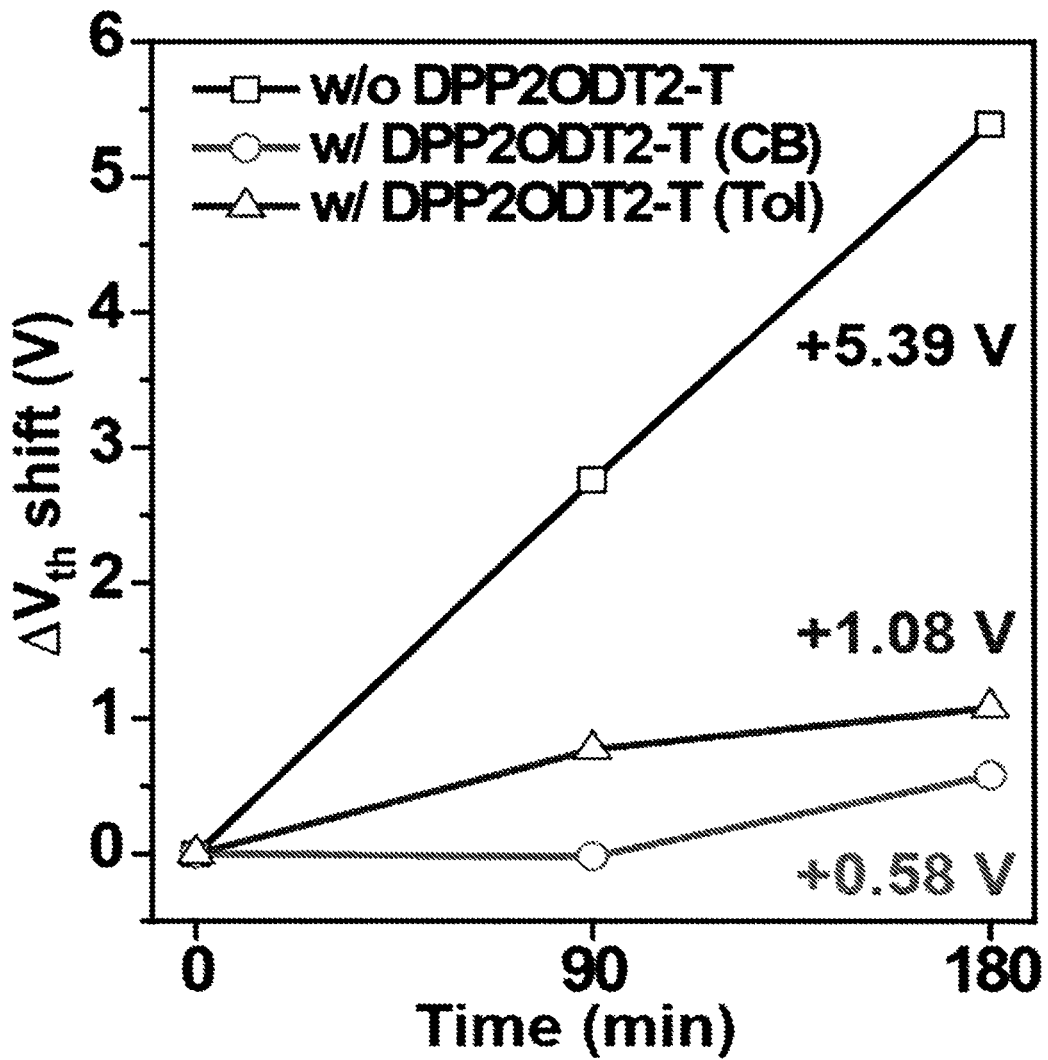

FIGS. 14 and 15 are views illustrating a stability of a biosignal monitoring sensor according to another exemplary embodiment of the present disclosure.

As a result of applying an artificial sweat on the manufactured element, it is confirmed that the stability against the sweat and moisture environment is improved by the hydrophobicity of DPP20DT2-T.

Figure 16:
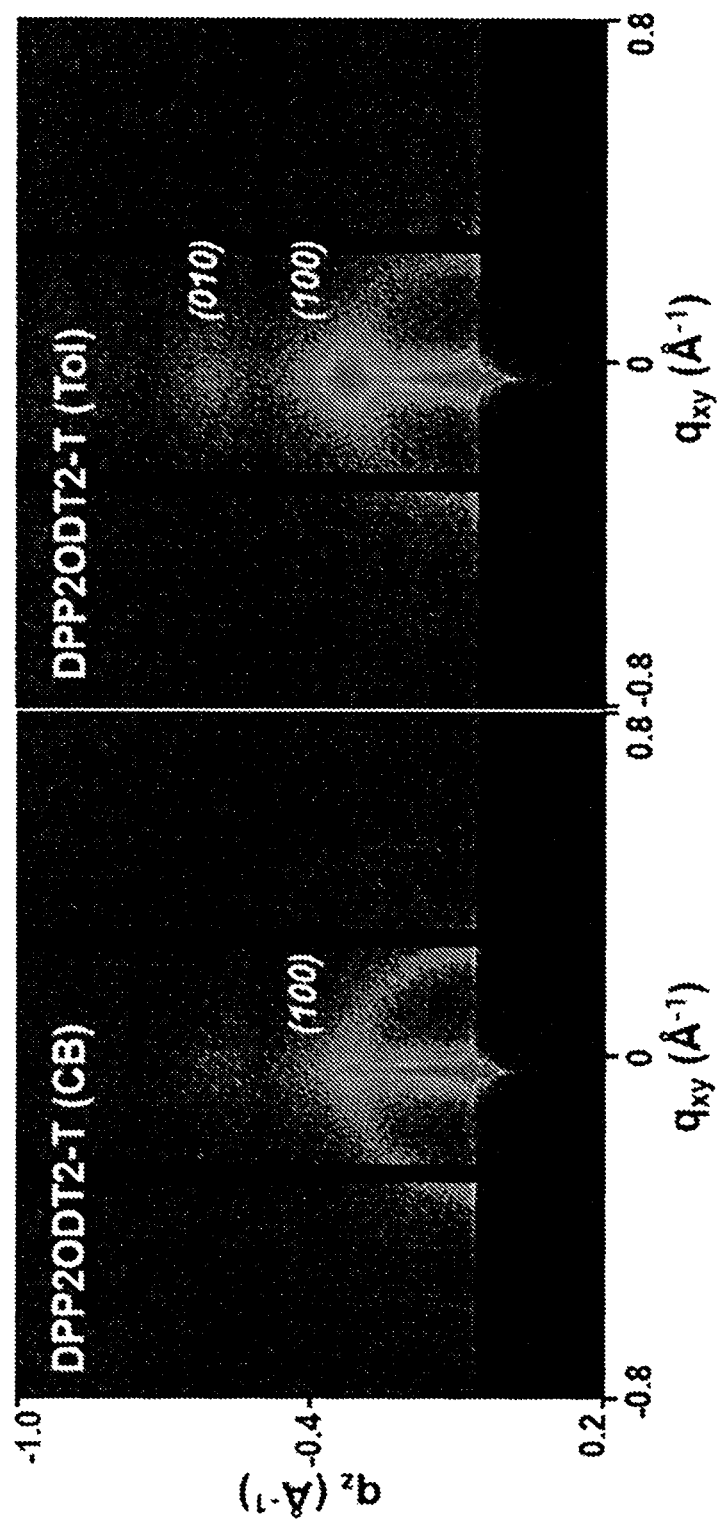
FIG. 16 is a view illustrating an orientation of a biosignal monitoring sensor according to another exemplary embodiment of the present disclosure.

FIG. 16 is a view illustrating an orientation of a biosignal monitoring sensor according to another exemplary embodiment of the present disclosure.

As a result of comparing the orientation by 2D grazing incidence wide angle X-ray scattering (2D-GIWAXS) measurement, it is confirmed that in DPP20DT2-T(CB), face-on is 51.2% and edge-on is 48.8% and in DPP20DT2-T(Tol), face-on is 61.5% and edge-on is 38.5%.

By adjusting not only the orientation of DPP20DT2-T (CB) and DPP20DT2-T(Tol), but also the orientation of the DPP polymer, the first light absorption layer has a first face-on orientation ratio and the second light absorption layer has a second face-on orientation ratio. Here, the first face-on orientation ratio is set to be higher than the second face-on orientation ratio.

In the first sensing mode, the first photo transistor may operate as a low power sensor according to the first face-on orientation ratio. In the second sensing mode, the second photo transistor may operate as a high precision sensor according to the second face-on orientation ratio.

Figure 17:
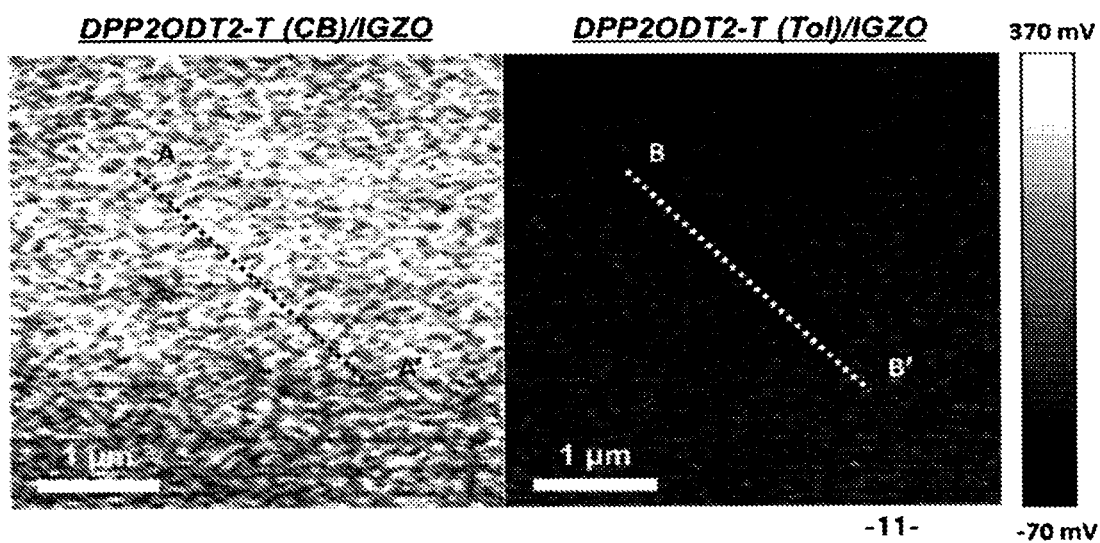
FIGS. 17 and 18 are views illustrating a surface potential of a biosignal monitoring sensor according to another exemplary embodiment of the present disclosure.
Figure 18:
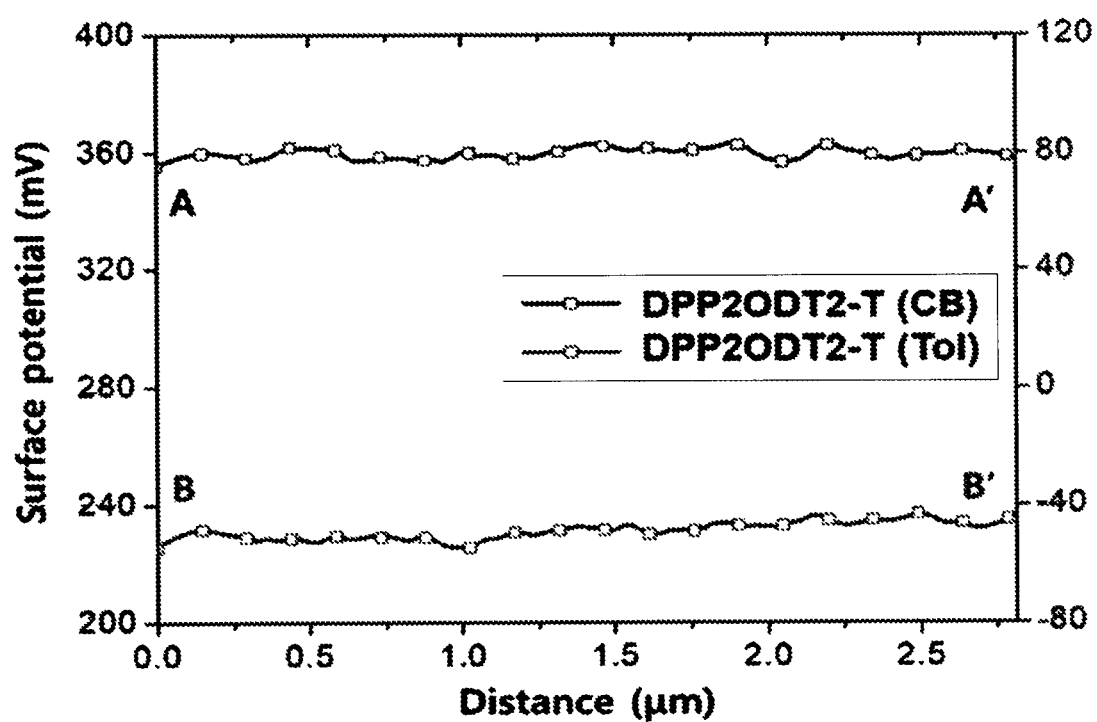

FIGS. 17 and 18 are views illustrating a surface potential of a biosignal monitoring sensor according to another exemplary embodiment of the present disclosure. FIGS. 17 and 18 illustrate a result of comparing surface potentials by Kelvin probe force microscopy (KPFM).

Figure 19:
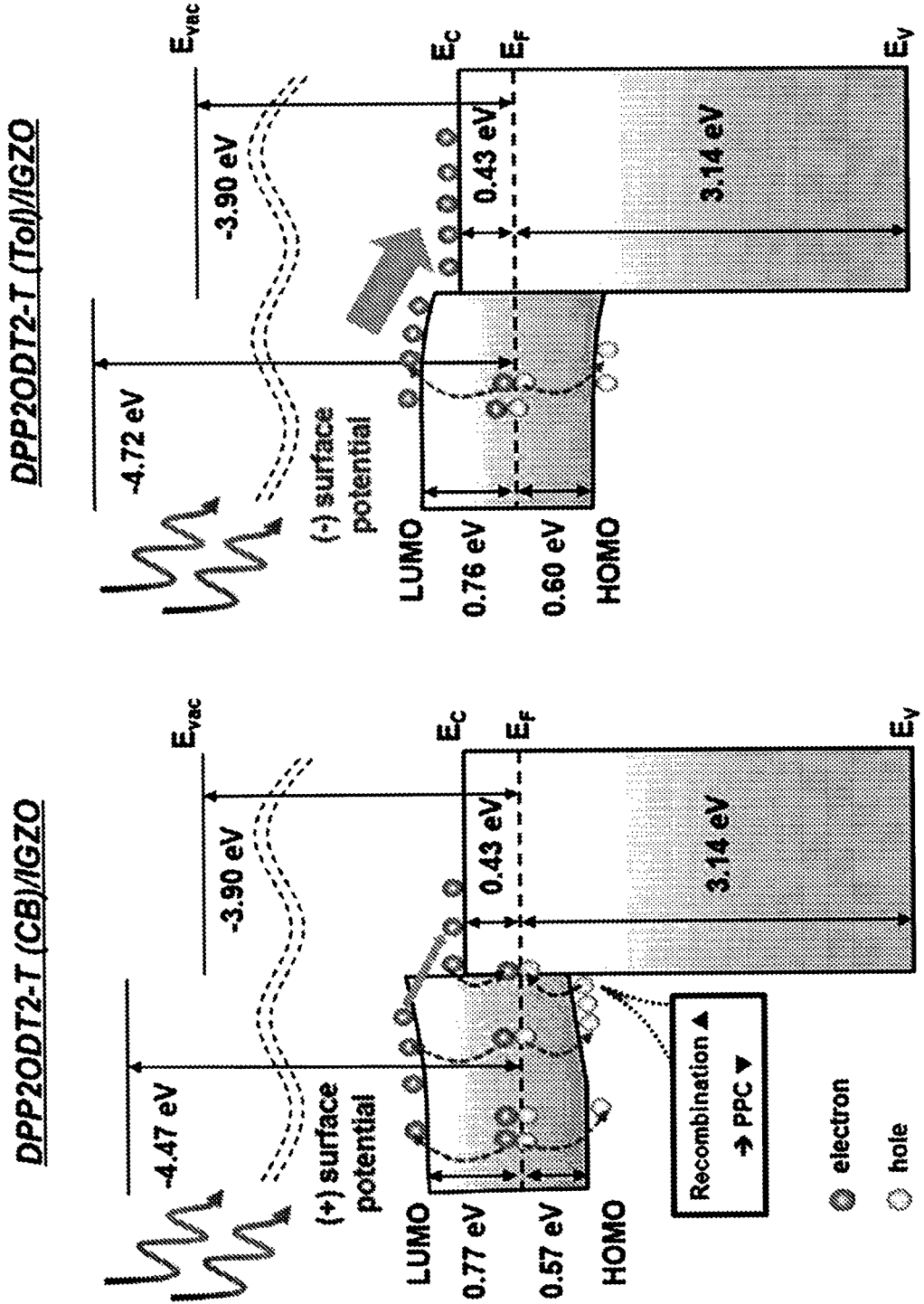
FIG. 19 is a view illustrating a mechanism of a biosignal monitoring sensor according to another exemplary embodiment of the present disclosure.

FIG. 19 is a view illustrating a mechanism of a biosignal monitoring sensor according to another exemplary embodiment of the present disclosure.

When the face-on orientation ratio of the organic material orientation ratio is reduced, the surface potential is increased, the potential barrier at the interface is increased, hole accumulation at the interface is increased, and re-combination of electrons and holes is increased to reduce neuroplasticity or persistent photoconductance.

When the face-on orientation ratio of the organic material orientation ratio is increased, the surface potential is reduced, the potential barrier at the interface is reduced, and a transport efficiency of the electron is increased to increase the photo sensitivity. However, the recombination of the excess electrons with the holes is not active so that the neuroplasticity or persistent photoconductance may occur.

The biosignal monitoring sensor according to the exemplary embodiment is a skin-conformable sensor and uses a low leakage current material so that it is appropriate for continuous monitoring. The biosignal monitoring sensor has advantages in that the skin transmittance is improved by near-infrared wavelength light source and the measurement accuracy is improved, and the light is not visible to the user. The biosignal monitoring sensor is implemented to be skin conformable and uses a stable material for external environment to improve effectiveness.

The biosignal monitoring sensor according to the present exemplary embodiment uses neuroplasticity or persistent photoconductance to vary the role of each unit sensor to be applied to a healthcare system as an always-on heart rate monitoring sensor. Further, the biosignal monitoring sensor may also be applied to various healthcare system such as a breathing monitoring sensor or an eye disease monitoring sensor, as well as the heart rate monitoring sensor.

In FIGS. 1 and 2, the respective processes are sequentially performed, but this is merely illustrative and those skilled in the art may apply various modifications and changes by partially changing the order illustrated in FIGS. 1 and 2 or performing one or more processes in parallel or adding another process without departing from the essential gist of the exemplary embodiment of the present disclosure.

The present embodiments are provided to explain the technical spirit of the present embodiment and the scope of the technical spirit of the present embodiment is not limited by these embodiments. The protection scope of the present embodiments should be interpreted based on the following appended claims and it should be appreciated that all technical spirits included within a range equivalent thereto are included in the protection scope of the present embodiments.

What is claimed is:

1. A biosignal monitoring sensor, comprising:
   a substrate;
   a light source which is connected to the substrate;
   a first photo transistor which is connected to the substrate and has a first light absorption layer; and
   a second photo transistor which is connected to the substrate and has a second light absorption layer,
   wherein the first photo transistor operates in a first sensing mode and the second photo transistor operates in a second sensing mode,
   wherein the first photo transistor and the second photo transistor transmit feedback to each other to be controlled to be on/off, such that when the first photo transistor is turned on, the second photo transistor is turned off, and when the second photo transistor is turned on, the first photo transistor is turned off,
   wherein the first photo transistor outputs a constant signal level at a low heart rate, a signal level being increased at a high heart rate, such that a higher heart rate results in a greater signal level,
   wherein the first photo transistor transmits a feedback to the second photo transistor based on a magnitude of a first signal output from the first photo transistor, and the second photo transistor transmits a feedback to the first photo transistor based on a frequency of a second signal output from the second photo transistor, the first and second signals corresponding to a biosignal monitored by the biosignal monitoring sensor, and wherein in the first sensing mode, the first photo transistor operates as a low power sensor at the low heart rate, and in the second sensing mode, the second photo transistor operates as a high precision sensor at the high heart rate.

2. The biosignal monitoring sensor according to claim 1, wherein the first light absorption layer has a first face-on orientation ratio, the second light absorption layer has a second face-on orientation ratio, and the first face-on orientation ratio is set to be higher than the second face-on orientation ratio.

3. The biosignal monitoring sensor according to claim 2, wherein in the first sensing mode, the first photo transistor operates as the low power sensor according to the first face-on orientation ratio.

4. The biosignal monitoring sensor according to claim 2, wherein in the second sensing mode, the second photo transistor operates as the high precision sensor according to the second face-on orientation ratio.

\* \* \* \* \*